(12) United States Patent
Naaman et al.

(10) Patent No.: US 8,508,280 B2
(45) Date of Patent: Aug. 13, 2013

(54) QUBIT READOUT VIA RESONANT SCATTERING OF JOSEPHSON SOLITONS

(75) Inventors: Ofer Naaman, Ellicott City, MD (US); Jae I. Park, Boulder, CO (US); Aaron A. Pesetski, Gambrills, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 83 days.

(21) Appl. No.: 13/180,034

(22) Filed: Jul. 11, 2011

(65) Prior Publication Data
US 2013/0015885 A1    Jan. 17, 2013

(51) Int. Cl.
*H03K 17/92* (2006.01)

(52) U.S. Cl.
USPC ................. 327/367; 326/3; 333/32

(58) Field of Classification Search
USPC ................. 327/367; 326/3, 4, 5; 333/32, 33, 333/34, 35
See application file for complete search history.

(56) References Cited

U.S. PATENT DOCUMENTS 7,613,765 B1 * 11/2009 Hilton et al. ................. 708/801

OTHER PUBLICATIONS

A. Herr, A. A Fedorov, A. Shnirman, E. Ilichey, G. Schon, "Design of a Ballistic Fluxon Qubit Readout", Superconductor Science and Technology 20, S450 (2007).*

D. Wahyu, A. Clerk, "Entanglement dynamics in a dispersively coupled qubit-oscillator system", Physical Review A 78, 042323 (2008).*
D.V. Averin, K. Rabenstein, V.K. Semenov, "*Rapid Ballistic Readout for Flux Qubits*", Physical Review B 73, 094504 (2006).
A. Fedorov, A. Shnirman, G. Schon, and A. Kidiyarova-Shevchenko, "*Reading Out the State of a Flux Qubit by Josephson Transmission Line Solitons*", Physical Review B 75, 224504 (2007).
M. Grajcar, S.H.W. van der Ploeg, A. Izmalkov, E. Ilichev, H.-G. Meyer, a. Fedorov, A. Shnirman, and G. Schon, "*Sisyphus Cooling and Amplification by a Superconducting Qubit*", Nature Physics 4, 612 (2008).
A. Herr, A. Fedorov, A. Shnirman, E. Ilichev, G. Schon, "*Design of a Ballistic Fluxon Qubit Readout*", Superconductor Science and Technology 20, S450 (2007).
M.D. Reed, B.R. Johnson, A.A. Houck, L. DiCarlo, L.M. Chow, D.I. Schuster, L. Frunzio, and R.J. Schoelkopf, "*Fast Reset and Suppressing Spontaneous Emission of a Superconducting Qubit*", Applied Physics Letters 96, 203110 (2010).
S.O. Valenzuela, W.D. Oliver, D.M. Berns, K.K. Berggren, L.S. Levitov and T.P. Orlando, "*Microwave-induced Cooling of a Superconducting Qubit*"; Science 314, 1589 (2006).

* cited by examiner

*Primary Examiner* — Long Nguyen
*Assistant Examiner* — Thomas Skibinski
(74) *Attorney, Agent, or Firm* — Tarolli, Sundheim, Covell & Tummino LLP

(57) ABSTRACT

Systems and methods are provided for reading an associated state of a qubit. A first soliton is injected along a first Josephson transmission line coupled to the qubit. A velocity of the first soliton is selected according to a physical length of the qubit and a characteristic frequency of the qubit. A second soliton is injected at the selected velocity along a second Josephson transmission line that is not coupled to the qubit. A delay associated with the first soliton is determined relative to the second soliton.

20 Claims, 4 Drawing Sheets

QUBIT READOUT VIA RESONANT SCATTERING OF JOSEPHSON SOLITONS

TECHNICAL FIELD

The present invention relates generally to quantum computing systems, and more particularly to a reading of a state of a qubit via resonant scattering of Josephson solitons.

BACKGROUND

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g., high voltage) or a logical zero (e.g., low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability means that a quantum computer can solve certain problems with exponentially greater efficiency than that of a classical computer.

SUMMARY

In accordance with one aspect of the invention, an apparatus includes a Josephson transmission line and a soliton driver configured to provide a soliton to propagate along the Josephson transmission line. A soliton detector is configured to determine a time-of-flight of the soliton, and a phase qubit is coupled to the Josephson transmission line. The phase qubit has a first characteristic frequency and a second characteristic frequency corresponding to a first state and a second state of the qubit. At least one of the soliton detector, the Josephson transmission line, and the phase qubit are configured such that the phase qubit applies a first delay to the propagation of the soliton along the Josephson transmission line when the phase qubit is in a first state associated with the first characteristic frequency and applies a second delay to the propagation of the soliton along the Josephson transmission line when the phase qubit is in a second state associated with the second characteristic frequency.

In accordance with another aspect of the invention, an apparatus includes a first Josephson transmission line, a qubit coupled to the first Josephson transmission line, and a second Josephson transmission line that is not coupled to the qubit. A soliton driver is configured to inject a first soliton along the first Josephson transmission line and a second soliton along the second Josephson transmission line. The first and second solitons have a velocity selected according to a physical length of the qubit and a characteristic frequency of the qubit. A soliton detector is configured to detect an arrival of each of the first soliton and the second soliton and determine a delay associated with the first soliton relative to the second soliton.

In accordance with a further aspect of the invention, a method is provided for reading an associated state of a qubit. A first soliton is produced along a first Josephson transmission line coupled to the qubit. A velocity of the first soliton is selected according to a physical length of the qubit and a characteristic frequency of the qubit. A second soliton is produced at the selected velocity along a second Josephson transmission line that is not coupled to the qubit. A delay associated with the first soliton is determined relative to the second soliton.

DETAILED DESCRIPTION

Figure 1:
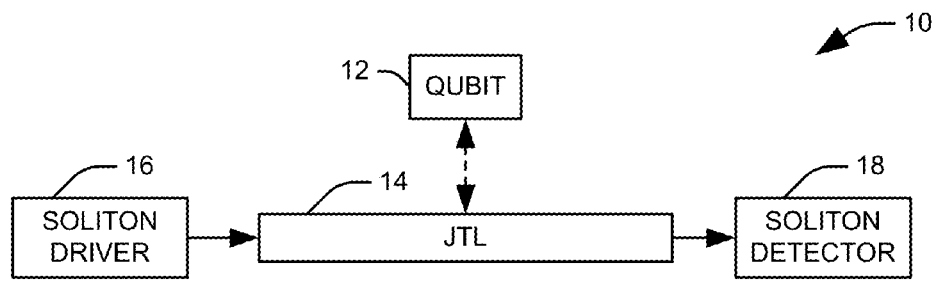
FIG. 1 illustrates an assembly for reading out a state of a qubit in accordance with an aspect of the present invention.

Even under ideal circumstances, reading the state of a quantum bit projects the measured state on the qubit, effectively collapsing any superposition of states within the qubit (i.e., reducing the amplitude of any non-measured states to zero). Current methods of measuring a state of some varieties of qubits, such as the tunneling readout of phase qubits, actually destroy the Hamiltonian eigenstates of the qubit by substantially and irreversibly modifying the qubit spectrum, such that the qubit cannot be used again without a time-consuming reinitialization of the qubit. It will be appreciated that this reinitialization will take considerable more time than a simple reset of a qubit to an initial state.

In accordance with an aspect of the present invention, a device can utilize sine-Gordon solitons (fluxons) propagating on a Josephson transmission line that is coupled to a qubit in a manner that enables the use of such device for nondestructive readout. It is known that phase qubits and qubits of similar design lack a direct mapping of their states to a magnetic flux or reactance, making them unsuitable for the so-called ballistic soliton readout approach. In accordance with an aspect of the present invention, however, the sensitivity of a soliton time-delay to an associated state of a qubit can be enhanced for the purpose of qubit readout, allowing a ballistic readout methodology to be used for phase qubits and similar qubit types by exploiting resonant interactions between the qubit and the solitons. The soliton time-of-flight can be made sensitive to small changes in the qubit resonance frequency and thereby to the qubit state. Accordingly, by measuring changes in the time of flight of the soliton, the state of the qubit can be determined non-destructively.

To this end, the qubit state is mapped onto soliton propagation delay via the state-dependent resonance frequency of the qubit. The qubit is probed by one soliton, a train of solitons, or a single soliton exposed to the qubit multiple times, and the propagation delay can be determined. By tuning the soliton velocity, which can be controlled by a DC (direct current) bias current through the JTL or by an initial shape of the soliton pulse, the qubit-dependent response of the ballistic soliton can be maximized and measured as a function of the detuning of the soliton velocity and the qubit transition frequency. By tuning the velocity of the incident fluxon, it is possible to create a scattering resonance between the fluxon and the qubit, where the interaction is strongest. This resonant regime provides a number of advantages in reading out certain types of qubits, such as lower power dissipation, preservation of the qubit spectrum during readout, simplification of integration, increased measurement speed, and faster acquisition rate of information about the state of the qubit per scattering event. Furthermore the measurement sensitivity may be increased with an appropriate geometry that allows for multiple scattering of the same fluxon with the qubit.

FIG. 1 illustrates an assembly 10 for reading out a state of a qubit 12 in accordance with an aspect of the present invention. For example, the qubit 12 can be a phase qubit, a transmon-type qubit, a quantronium-type qubit, or similar design. The assembly 10 includes a Josephson transmission line (JTL) 14 and a soliton driver 16 configured to provide solitons along the JTL. For example, the soliton driver 16 can produce quanta of magnetic flux, referred to as fluxons, which propagate along the JTL 14. The qubit 12 is coupled, for example, capacitively or inductively, to the JTL 14, and, depending on an associated velocity of the propagating soliton, can have a state-dependent effect on the time-of-flight. For example, the qubit 12 can produce a first delay in the propagation of the soliton when the qubit is in a first state and produce a second delay in the propagation of the soliton when the qubit is in a second state, and the difference in the time-of-flight can be determined at a soliton detector 18 coupled to the JTL 14. For example, the qubit 12 can be determined to be in the first state if the measured delay falls within a first range and in a second state if the measured delay falls within a second range. It will be appreciated, however, that other methods can be utilized for exploiting the state-dependence of the delay introduced by the qubit 12 to readout the qubit state.

In accordance with an aspect of the present invention, the delay induced by the soliton is caused by inelastic scattering of the soliton by the qubit, causing the soliton to lose kinetic energy and slowing its propagation though the JTL 14. This inelastic scattering is state-dependent, with the kinetic energy lost from the soliton, and therefore its velocity after scattering, being dependent on a transition frequency of the qubit 12 to higher energy levels. Accordingly, by exploiting the difference between the energy of the transition between the ground state and the first excited state and the energy of the transition between the first excited state and the second excited state, it is possible to determine an associated state of the qubit 12 from the magnitude of the delay induced in the soliton.

In one implementation, the soliton driver 16 can be configured to provide the solitons at a particular velocity, as to maximize a difference between the delays produced by the qubit in its first and second states. Specifically, the velocity of the soliton can be selected according to a physical length of the qubit 12 and a characteristic frequency of the qubit. For example, the velocity can be selected such that a product of the velocity, a physical length of the qubit 12, and the characteristic frequency of the qubit, such as a frequency associated with a state transition within the qubit, is substantially equal to one. The velocity of the soliton can be controlled by altering an associated shape of the pulse produced at the soliton driver 16 or by adjusting a direct current (DC) bias applied to the JTL 14.

For example, a propagating solution for the soliton can be written as:

$$\phi(x, t) = 4\tan^{-1}\left[\exp\left(\frac{x - x_0 - ut}{\sqrt{1 - u^2}}\right)\right] \quad \text{Eq. 1}$$

wherein $\phi$ is the magnetic flux, x is a position along the JTL, $x_0$ is a reference position, t is time, and u is the soliton velocity.

Assuming the soliton generator is at the reference position, to provide a desired velocity, u, the voltage necessary at the generator can be described as:

$$V_{gen}(t) = \frac{d\phi(x, t)}{dt}\bigg|_{x=x0} = \frac{2u}{\sqrt{1 - u^2}}\text{sech}\left(\frac{-ut}{\sqrt{1 - u^2}}\right) \quad \text{Eq. 2}$$

Generalizing from the above, high velocity solitons can be generated from short, relatively high voltage pulses, while low velocity solitons can be generated from relatively long, low voltage pulses. The velocity of the soliton can be further tuned by applying a DC current to the JTL 14. This bias current applies a Lorentz force on the traveling soliton, and can either increase or decrease the velocity, depending on the polarity of the bias current.

Figure 3:
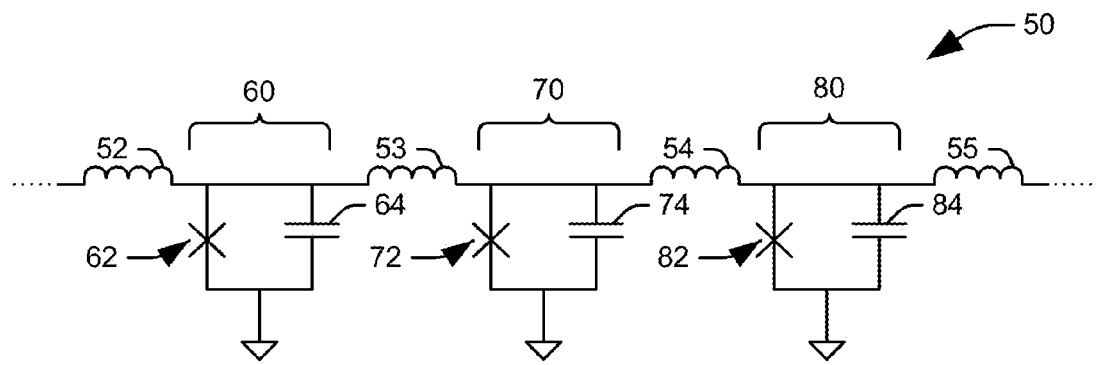
FIG. 3 illustrates one implementation of a Josephson transmission line.

To demonstrate the operation of the readout, the qubit 12 can be modeled as a parallel LCR oscillator, whose inductance is $L_r$, capacitance is $C_r$ and losses are modeled by a resistor R. In this model, it is assumed that the qubit 12 and the JTL are coupled inductively, although, as mentioned previously, other configurations can be used. The dynamical variable of the oscillator is the branch flux, $\phi_r$, which is related to the resonator inductance via $\phi_r = L_r I_r$, with $I_r$ representing the current through the resonator inductance. The coupling of the resonator to the JTL at a site N is represented by the transformer equation:

$$\begin{pmatrix} \phi_N - \phi_{N+1} \\ \phi_r \end{pmatrix} = \begin{pmatrix} L & -M \\ M & -L_r \end{pmatrix}\begin{pmatrix} I_N \\ I_r \end{pmatrix} \quad \text{Eq. 3}$$

where $\phi_n$ are node fluxes of the JTL 14, M is a mutual inductance between the qubit 12 and the JTL, L is a series inductance of the JTL (e.g., 53 or 54 in FIG. 3), and $I_N$ is a current associated with an $n^{th}$ cell of the JTL (e.g., 60 or 70 in FIG. 3).

An equation of motion for the resonator can be written as:

$$\ddot{\phi}_r + \frac{1}{RC_r}\dot{\phi}_r + \frac{\omega_r^2}{1-k^2}\phi_r = \omega_r^2 \frac{M}{L(1-k^2)}(\phi_N - \phi_{N+1}) \quad \text{Eq. 4}$$

where the second term on the left accounts for resonator losses, $\omega_r^2 = 1/L_r C_r$ is the resonator frequency, and $k = M/\sqrt{L_r L}$ is the qubit-JTL coupling strength.

The equation of motion for the JTL 14 in the continuum limit is:

$$C\frac{\partial^2 \phi}{\partial t^2} = \frac{1}{L}\frac{\partial^2 \phi}{\partial x^2} - \frac{1}{L_J}\sin\phi + \delta'(x)\left\{\frac{k^2}{L}\frac{\partial \phi}{\partial x} - \frac{M}{L_r L(1-k^2)}\phi_r\right\} \quad \text{Eq. 5}$$

The JTL 14 is described by a sine-Gordon equation of motion, having a soliton solution propagating along the line with a velocity u. The last term on the right results from current induced in the JTL 14 by its coupling to the qubit 12 and is treated as a perturbation. The perturbed sign-Gordon equation above can be transformed into two equations of motion for the position (X) and velocity (u) of a soliton solution to give:

$$\frac{du}{dt} = \quad \text{Eq. 6}$$
$$-\tanh\Theta_0 \text{sech}\Theta_0 \left\{\frac{1}{4}(1-u^2)\frac{k}{1-k^2}\sqrt{\frac{L}{L_r}}\phi_r - k^2\sqrt{\frac{L}{L_J}}\text{sech}\Theta_0\right\}$$

$$\frac{dX}{dt} = u + \frac{1}{4}u\text{sech}\theta_0\left\{\frac{2k^2}{\sqrt{1-u^2}}\sqrt{\frac{L}{L_J}}\text{sech}\theta_0(1-2\theta_0\tanh\theta_0) - \frac{k}{1-k^2}\sqrt{\frac{L}{L_r}}(1-\theta_0\tanh\theta_0)\phi_r\right\} \quad \text{Eq. 7}$$

where $$\Theta_0 = \frac{X}{\sqrt{1-u^2}}.$$

Figure 2:
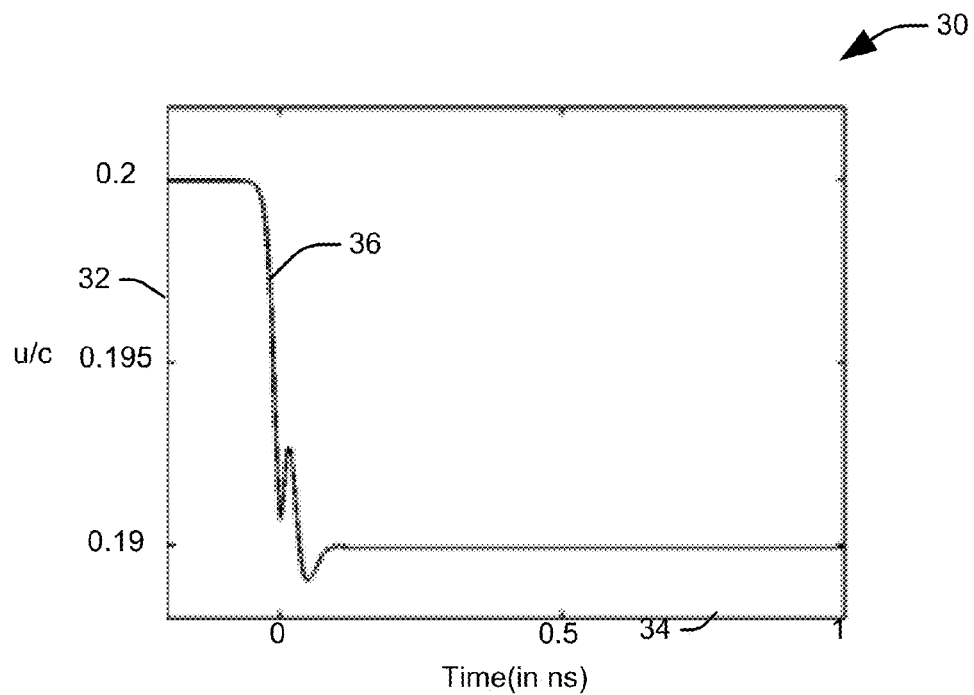
FIG. 2 illustrates a chart of the time evolution of the soliton velocity.

FIG. 2 illustrates a chart 30 of the time evolution of the soliton velocity, obtained by numerically integrating the above equations of motion. In this example, the resonator frequency is 10 GHz, the JTL plasma frequency is 50 GHz, and the soliton initial velocity is 0.2 c, where c is the Swihart velocity. The Swihart velocity represents a characteristic velocity of a given Josephson transmission line and represents a maximum velocity at which a soliton will propagate on a Josephson transmission line. The Swihart velocity of a JTL is determined as the product of a plasma frequency, $\omega_p$, of the JTL and an associated Josephson penetration length, $\lambda_J$ of the JTL. The Josephson penetration length can, in turn, be determined as the product of a cell length, a, of the JTL multiplied by a square root of a ratio of the series inductance of the JTL to a shunt inductance of the JTL.

In the illustrated chart 30, the vertical axis 32 represents a normalized velocity of the soliton (e.g., the soliton velocity divided by the Swihart velocity for the transmission line) and the horizontal axis 34 represents time in units of nanoseconds. The center of mass of the soliton passes the JTL site that is coupled to the resonator at the point where the time is zero. As can be seen from the graph 36 of the soliton velocity, the interaction between the soliton and the resonator results in the soliton losing kinetic energy to the resonator (qubit). Accordingly, an overall delay is caused in the propagation of the soliton down the JTL.

FIG. 3 illustrates one implementation of a Josephson transmission line 50. The Josephson transmission line is a transmission line that does not support propagating small-amplitude modes below an associated junction plasma frequency, $\omega_p$. At frequencies higher than the plasma frequency, the Josephson transmission time supports propagating modes, referred to as plasmons. The Josephson transmission line includes a plurality of cells 60, 70, and 80 connected by series inductors 52-55. Each cell 60, 70, and 80 contains a Josephson junction 62, 72, and 82 shunted to ground through an associated capacitor 64, 74, and 84. The plasma frequency of the Josephson transmission line is defined by a critical current, $i_0$, for the Josephson junctions 62, 72, and 82 associated with each cell 60, 70, and 80 and a capacitance associated the shunt capacitors 64, 74, and 84. The series inductors 52-55 coupling the individual cells 60, 70, and 80 each have an associated inductance referred to herein as a series inductance, L, of the transmission line, and a shunt inductance, $L_j$, defined as an inductance of the Josephson junctions 62, 72, and 82, where $L_j = h/2ei_0$, where h is the reduced Planck constant ($h/2\pi$) and e is the elementary charge. It will be appreciated that the Josephson transmission line provides a compact structure that is both compatible with the low temperature operation desirable for quantum computing and capable of co-fabrication with a qubit using the same processing technology.

Figure 4:
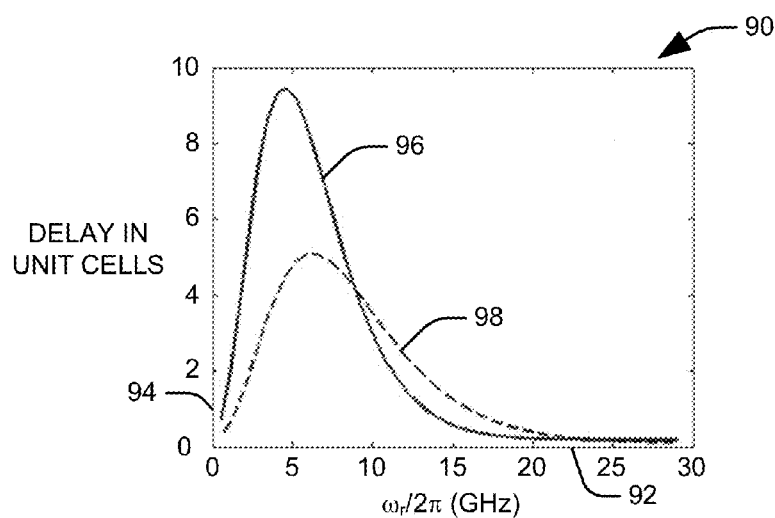
FIG. 4 illustrates a chart representing the frequency dependence of a delay induced by a qubit for solitons of two different velocities.

FIG. 4 illustrates a chart 90 representing the frequency dependence of a delay induced by a qubit for solitons of two different velocities. Specifically, the horizontal axis 92 represents the frequency of the qubit, in gigahertz, and the vertical axis 94 represents a delay, measured in unit cells of the Josephson transmission line. In one implementation, the JTL can have a plasma frequency of $\omega_p/2\pi=58$ GHz, with the Josephson junctions having associated inductances of 32 pH and shunt capacitors having associated capacitances of 235 fF. The series inductors of the JTL are selected to have an inductance of 8 pH. In one example, the Josephson transmission line can be configured with two hundred cells and have a total length on the order of several millimeters.

A solid line 96 represents the frequency-dependent delay induced in a soliton by the qubit when the soliton is propagating at a first velocity, specifically 0.15 c, where c is the Swihart velocity. A dashed line 98 represents the frequency-dependent delay induced in a soliton by the qubit when the soliton is propagating at a second velocity, specifically 0.2 c. It will be appreciated that the frequency dependence of the soliton delay at the first velocity 96 is substantially more pronounced that the frequency dependence at the second velocity 98, and accordingly, the delay induced in the soliton with be significantly more sensitive to frequency within the five to ten gigahertz range. The readout is sensitive to the change in the resonance frequency of the resonator (or qubit); therefore the best sensitivity is expected for cases where the resonator is slightly detuned from the soliton-qubit resonance condition (maxima of respective lines 96 and 98 in FIG. 4), as this is where the change in the soliton delay has a greater response to small changes in the resonator frequency. In FIG. 4, a soliton injected with initial velocity of 0.15 c will be most sensitive to small changes in the resonator frequency about 7 GHz, whereas a soliton injected with velocity of 0.2 c will be most sensitive to resonators around 10 GHz.

Figure 5:
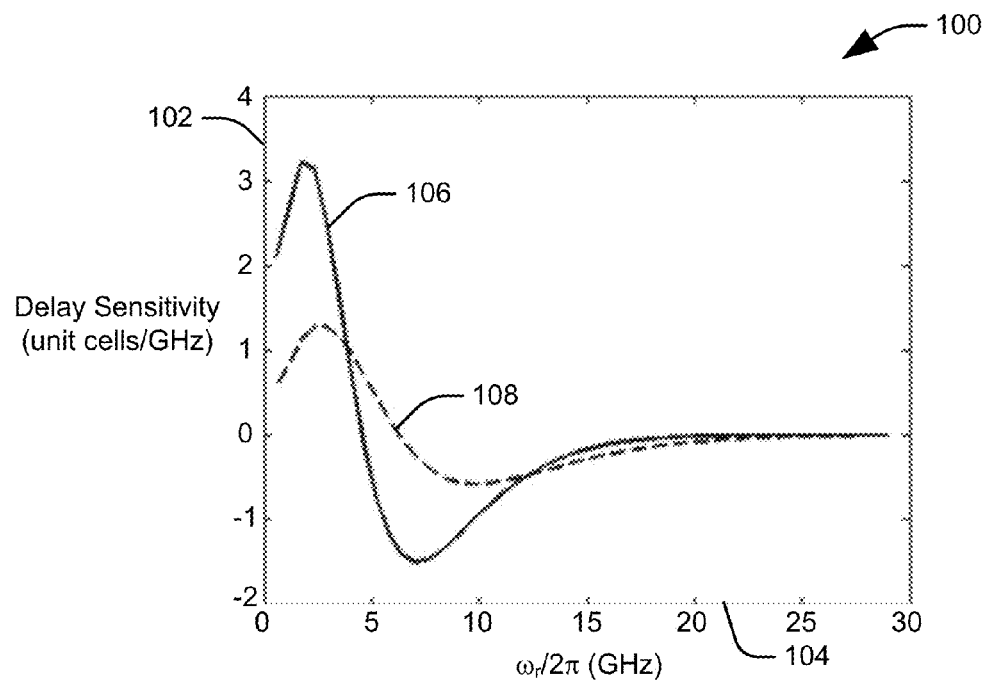
FIG. 5 is a chart illustrating a sensitivity of solitons propagating on a JTL at varying velocities to a delay induced by a qubit as a function of a resonant frequency of the qubit.

FIG. 5 is a chart 100 illustrating a sensitivity of solitons propagating on a JTL at varying velocities to a delay induced by a qubit as a function of a resonant frequency of the qubit. The vertical axis 102 represents the delay sensitivity, in unit cells per GHz, using the same parameters as FIG. 4 above. The horizontal axis 104 represents a resonant frequency of the qubit. A delay sensitivity of a soliton having an initial velocity of 0.15 c is shown as a solid line 106, and a delay sensitivity of a soliton having an initial velocity of 0.2 c is shown as a dashed line 108.

As can be seen from the chart, solitons injected with initial velocity of 0.15 c could resolve a 200 MHz change in the frequency of a qubit that was initially at 7 GHz, by a change in their delay amounting to 0.3 unit cells, or, given such a soliton travels approximately one hundred unit cells per nanosecond, three picoseconds, after traversing a 200-cell long JTL. For a different set of parameters, where k=0.15, $L_J$=20 pH, L=10 pH, $L_r$=300 pH, $\omega_p/2\pi$=92 GHz (C=150 fF), and an injection velocity of 0.14 c, the same variation in the qubit frequency yields a delay of sixteen picoseconds, easily resolved with current technology. It will be appreciated that the soliton is also sensitive to changes in resonators of lower frequencies. For the illustrated example, maximum sensitivity can be obtained at 1.7 GHz and 2.9 GHz with solitons injected at 0.15 c and 0.2 c, respectively.

Figure 6:
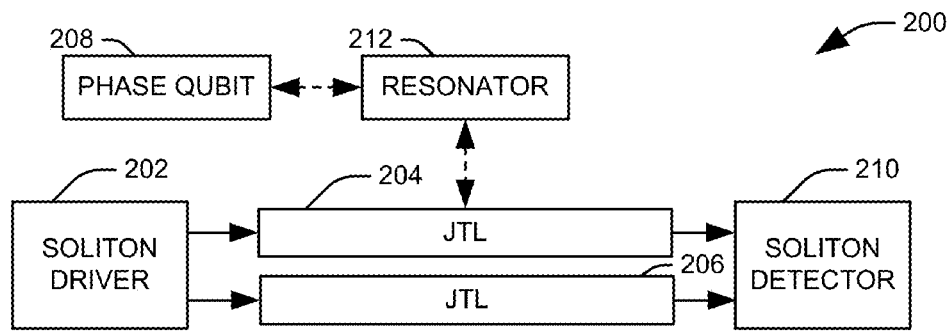
FIG. 6 illustrates a first implementation of a system in accordance with an aspect of the present invention.

FIG. 6 illustrates a first implementation of a system 200 in accordance with an aspect of the present invention. In the illustrated system, two solitons with opposite polarities are injected by a soliton driver 202 into two Josephson transmission lines 204 and 206. A first JTL 204 is coupled to a phase qubit 208 and a second JTL 206 is used as a timing reference. A soliton detector 210 is coupled to each of the two JTLs 204 and 206 to detect the arrival of the injected solitons. In one implementation, the soliton detector 210 can include a combiner to determine coincident arrival of the solitons. Specifically, if the solitons are coincident they will annihilate within the combiner, and no output pulse will be generated. If the transit times of the two paths are different, the solitons will arrive at the combiner at the different times and thus generate an output pulse. It will be appreciated, however, that the soliton detector 210 can include any appropriate circuitry for detecting a difference in arrival time between the two solitons.

It will be appreciated from the description above that, depending on the specific implementation, the phase qubit 208 can be coupled, either inductively or capacitively, to the first JTL 204 without any intermediating structure. In the illustrated implementation, however, the first JTL 204 is not coupled directly to the phase qubit 208. Instead, since the soliton is sensitive to changes of the resonant frequency of an oscillator, the phase qubit 208 can be coupled dispersively to a resonator 212, which, in turn, couples to the first JTL 204. While the qubit 208 is illustrated herein as a phase qubit, this dispersive coupling arrangement can be particularly helpful to perform readout on qubits of the transmon or quantronium type.

In one implementation, the soliton-qubit interaction can be resonantly enhanced by restricting the volume of interaction between phase qubit and soliton, such that each incident soliton is made to interact with the phase qubit multiple times, as quantitatively characterized by a finesse F=u/ex, where u is the velocity of the soliton, is the length of the line, and κ is the energy decay rate of the cavity. To this end, the JTLs 204 and 206 are suitably terminated with impedance mismatched ends, allowing scattering of solitons off of each JTL 204 and 206 at intervals comparable to the resonant frequency of the cavity formed by the JTL. Accordingly, incident solitons may be scattered with a state-dependent phase (transmission/reflection or delay) that is resolvable, and the cumulative effect of the multiple exposures can be utilized to determine an associated state of the qubit.

Figure 7:
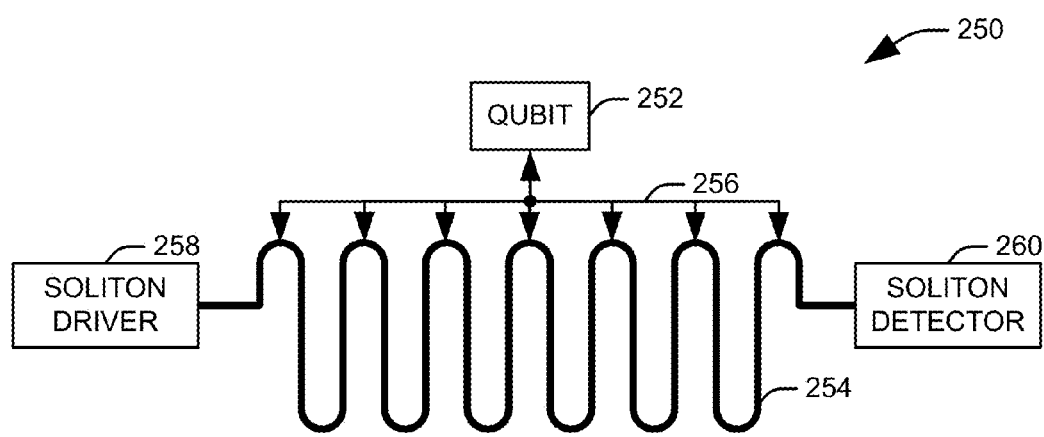
FIG. 7 illustrates a second implementation of a system in accordance with an aspect of the present invention.

FIG. 7 illustrates a second implementation of a system 250 in accordance with an aspect of the present invention. In this implementation, the qubit 252 can be coupled to multiple nodes along the JTL 254, which are separated by a distance l, such that the soliton interacts with the qubit multiple times and effectively presents the qubit with a periodic train of impulses. To this end, a coupling element 256 is configured to couple the qubit 252 to the JTL 254 at multiple locations, such that when a pulse is generated at a soliton driver 258, the qubit applies a first delay to the propagation of the soliton along the JTL multiple times when the qubit is in a first state and applies a second delay to the propagation of the soliton along the JTL multiple times when the qubit is in a second state. The difference in the time-of-flight caused by these delays can be determined at a soliton detector 260 coupled to the JTL 254 to determine an associated state of the qubit.

Figure 8:
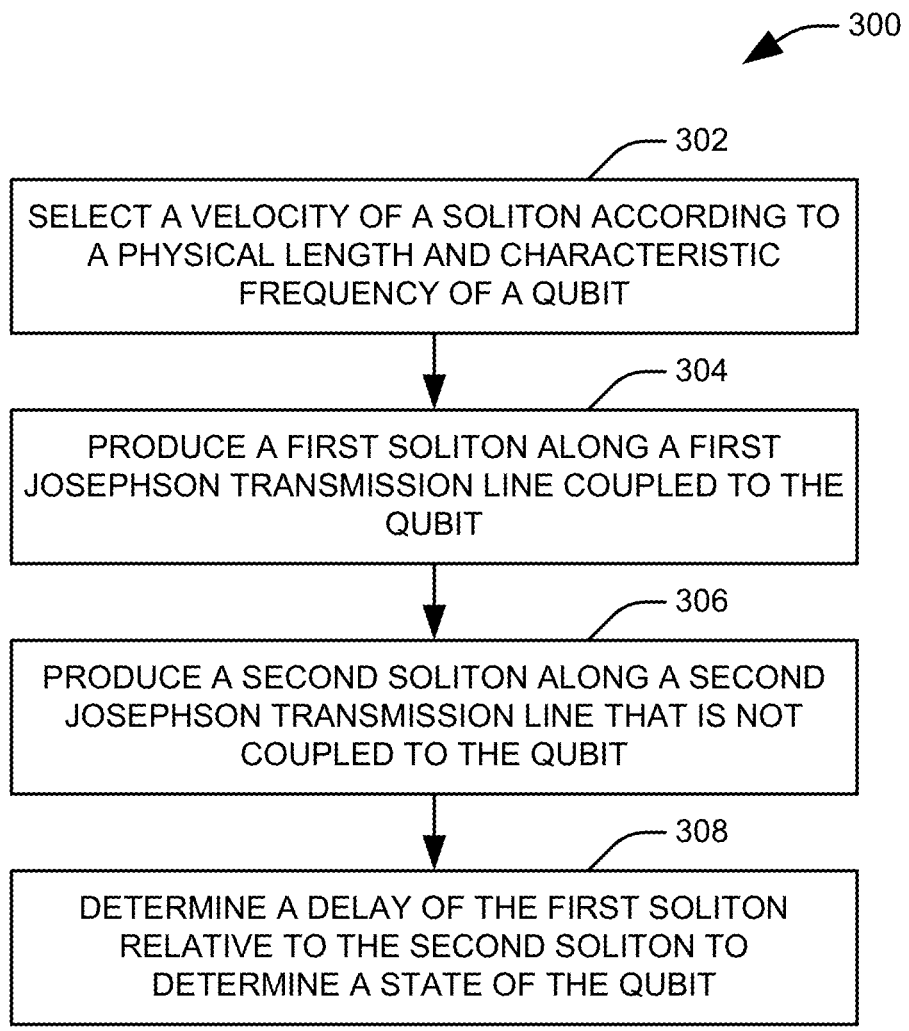
FIG. 8 illustrates a method for reading an associated state of a qubit in accordance with an aspect of the present invention.

FIG. 8 illustrates a method 300 for reading an associated state of a qubit in accordance with an aspect of the present invention. At 302, a velocity of a soliton is selected according to a physical length of the qubit and a characteristic frequency of the qubit. For example, the velocity can be selected such that the product of the velocity, the physical length of the qubit, and the characteristic frequency of the qubit is substantially equal to one. At 304, a first soliton is produced along a first Josephson transmission line coupled to the qubit. At 306, a second soliton is produced at the selected velocity along a second Josephson transmission line that is not coupled to the qubit. At 308, a delay associated with the first soliton is determined relative to the second soliton to determine a state of the qubit. For example, it can be determined that the qubit is a ground state if the determined delay is within a first range and the qubit is in a first excited state if the determined delay is within a second range.

To summarize, systems and method in accordance with an aspect of the present invention provide means to read out a qubit, including a phase qubit, using coincidence measurements of sine-Gordon solitons propagating on a Josephson transmission line. These methods rely on resonantly enhanced scattering of the soliton; in one implementation when the soliton transit time near the qubit is commensurate with the qubit oscillation period and in another by ensuring repeated periodic interaction between the soliton and the qubit. An optimal readout sensitivity is obtained for frequencies slightly detuned from the resonance condition. This readout scheme is advantageous as it avoids tunneling of the qubit, an improvement that avoids dissipation in the vicinity of the qubit, which may activate unintended tunneling of neighboring qubits and emission of disruptive microwave radiation into the circuit, and relaxes qubit design constraints. The readout scheme also extracts the qubit's information in a manner compatible with single-flux-quantum (SFQ) based qubit control.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:
1. An apparatus comprising:
a Josephson transmission line;
a soliton driver configured to provide a soliton to propagate along the Josephson transmission line;
a soliton detector configured to determine a time-of-flight of the soliton; and
a phase qubit coupled to the Josephson transmission line, the phase qubit having a first characteristic frequency in a first state and a second characteristic frequency in a second state;

wherein at least one of the soliton detector, the Josephson transmission line, and the phase qubit are configured such that the phase qubit applies a first delay to the propagation of the soliton along the Josephson transmission line when the phase qubit is in the first state and applies a second delay to the propagation of the soliton along the Josephson transmission line when the phase qubit is in the second state.

2. The apparatus of claim 1, further comprising a coupling element configured to couple the qubit to the Josephson transmission line at multiple locations, such that the phase qubit applies the first delay to the propagation of the soliton along the Josephson transmission line multiple times when the phase qubit is in the first state and applies the second delay to the propagation of the soliton along the Josephson transmission line multiple times when the phase qubit is in the second state.

3. The apparatus of claim 1, the soliton being a first soliton and the Josephson transmission line being a first Josephson transmission line, the soliton driver being configured to provide a second soliton to propagate along a second Josephson transmission line.

4. The apparatus of claim 3, wherein the second Josephson transmission line is not coupled to the phase qubit, and the soliton detector is configured to determine a difference in the time-of-flight between the first soliton and the second soliton.

5. The apparatus of claim 4, wherein the soliton driver is configured to provide the second soliton with a polarity opposite of a polarity of the first soliton, the soliton detector comprising a combiner to determine coincident arrival of the solitons, such that if the solitons are coincident they will annihilate within the combiner without producing an output pulse.

6. The apparatus of claim 1, the phase qubit having a characteristic frequency, and the soliton driver being configured to provide the soliton with a velocity based on the characteristic frequency of the phase qubit.

7. The apparatus of claim 6, the characteristic frequency of the phase qubit being a first characteristic frequency of the phase qubit and the phase qubit having a second characteristic frequency, the velocity of the soliton being determined such that a difference between a first delay experienced by the soliton when the phase qubit is in a first state associated with the first characteristic frequency and a second delay experienced by the soliton when the phase qubit is in a second state associated with the second characteristic frequency is maximized.

8. The apparatus of claim 1, wherein the phase qubit is inductively coupled to the Josephson transmission line.

9. The apparatus of claim 1, wherein the phase qubit is capacitively coupled to the Josephson transmission line.

10. An apparatus, comprising:
a first Josephson transmission line;
a qubit coupled to the first Josephson transmission line;
a second Josephson transmission line that is not coupled to the qubit;
a soilton driver configured to inject a first soliton along the first Josephson transmission line and a second soliton along the second Josephson transmission line, the first and second solitons having a velocity selected according to a physical length of the qubit and a characteristic frequency of the qubit; and
a soliton detector configured to detect an arrival of each of the first soliton and the second soliton and determine a delay associated with the first soliton relative to the second soliton.

11. The apparatus of claim 10, wherein the qubit is a phase qubit.

12. The apparatus of claim 10, wherein the qubit is a transmon qubit.

13. The apparatus of claim 10, wherein the qubit is a quantronium qubit.

14. The apparatus of claim 10, wherein the velocity of the first and second solitons is selected such that the product of the velocity, the physical length of the qubit, and the characteristic frequency of the qubit is substantially equal to one.

15. The apparatus of claim 10, the characteristic frequency of the qubit being a first characteristic frequency of the qubit, the determined delay being a first delay, and the qubit having a second characteristic frequency, the velocity of the first and second solitons being determined such that a difference between the first delay, experienced by the first soliton when the qubit is in a first state associated with the first characteristic frequency, and a second delay, experienced by the first soliton when the qubit is in a second state associated with the second characteristic frequency, is maximized.

16. The apparatus of claim 10, wherein the qubit is dispersively coupled to a resonator, and the resonator is coupled to the first Josephson transmission line, such that the qubit is coupled to the first Josephson transmission line through the resonator.

17. A method for reading an associated state of a qubit, comprising:
producing a first soliton along a first Josephson transmission line coupled to the qubit, a velocity of the first soliton being selected according to a physical length of the qubit and a characteristic frequency of the qubit;
producing a second soliton at the selected velocity along a second Josephson transmission line that is not coupled to the qubit; and
determining a delay associated with the first soliton relative to the second soliton.

18. The method of claim 17, further comprising determining that the qubit is in a ground state if the determined delay is within a first range and determining that the qubit is in an excited state if the determined delay is within a second range.

19. The method of claim 17, further comprising selecting the velocity such that the product of the velocity, the physical length of the qubit, and the characteristic frequency of the qubit is substantially equal to one.

20. An apparatus comprising:
a Josephson transmission line terminated with impedance mismatched ends to allow for internal reflection of a soliton;
a soliton driver configured to provide the soliton to propagate along the Josephson transmission line;
a soliton detector configured to determine a time-of-flight of the soliton; and
a phase qubit coupled to the Josephson transmission line, the phase qubit having a first characteristic frequency in a first state and a second characteristic frequency in a second state;
wherein at least one of the soliton detector, the Josephson transmission line, and the phase qubit are configured such that the phase qubit applies a first delay multiple times to the propagation of the soliton along the Josephson transmission line when the phase qubit is in the first state and applies a second delay multiple times to the propagation of the soliton along the Josephson transmission line when the phase qubit is in the second state.

* * * * *